United States Patent [19]
Laskaris et al.

[11] Patent Number: 5,410,287
[45] Date of Patent: Apr. 25, 1995

[54] OPEN MRI MAGNET WITH UNIFORM MAGNETIC FIELD

[75] Inventors: Evangelos T. Laskaris, Schenectady; Bizhan Dorri, Clifton Park, both of N.Y.

[73] Assignee: General Electric Company, Schenectady, N.Y.

[21] Appl. No.: 223,200

[22] Filed: Apr. 5, 1994

[51] Int. Cl.⁶ .......................... H01F 1/00; H01F 5/00; G01V 3/00

[52] U.S. Cl. ...................... 335/216; 335/299; 324/318

[58] Field of Search ............... 335/216, 299, 300, 301; 324/318, 324

[56] References Cited

U.S. PATENT DOCUMENTS

| | | |
|---|---|---|
| 4,500,860 | 2/1985 | Vermilyea . |
| 4,506,247 | 3/1985 | Vermilyea . |
| 4,509,030 | 4/1985 | Vermilyea . |
| 4,523,166 | 6/1985 | Gross . |
| 4,581,580 | 4/1986 | Keim . |
| 4,658,229 | 4/1987 | Chen ............................ 335/216 |
| 4,724,412 | 2/1988 | Kalafala . |
| 4,748,429 | 5/1988 | Aubert ........................ 335/299 |
| 4,768,009 | 8/1988 | Shimada ...................... 335/299 |
| 4,875,485 | 10/1989 | Matsutani . |
| 4,924,198 | 5/1990 | Laskaris . |
| 4,985,678 | 1/1991 | Gangarosa .................... 324/318 |
| 4,986,078 | 1/1991 | Laskaris . |
| 5,003,276 | 3/1991 | Sarwinski et al. . |
| 5,006,804 | 4/1991 | Dorri et al. . |
| 5,032,869 | 7/1991 | Herd et al. . |
| 5,034,713 | 7/1991 | Herd et al. . |
| 5,083,105 | 1/1992 | Herd et al. . |
| 5,153,546 | 10/1992 | Laskaris . |
| 5,194,810 | 3/1993 | Breneman et al. . |
| 5,291,169 | 3/1994 | Ige ............................. 335/216 |

Primary Examiner—Leo P. Picard
Assistant Examiner—Stephen T. Ryan
Attorney, Agent, or Firm—Douglas E. Erickson; Paul R. Webb, II

[57] ABSTRACT

An open magnetic resonance imaging (MRI) magnet having first and second spaced-apart superconductive coil assemblies each including a toroidal-shaped coil housing containing a superconductive main coil and a superconductive bucking coil. The bucking coil is spaced radially inward and radially apart from the main coil. The bucking coil carries an electric current equal in amperage, and opposite in direction, to the main coil. The bucking coils overcome the gross magnetic field distortions in the imaging volume of the main coils (created by the open space between the magnet's superconductive coil assemblies) to produce a magnetic field of high uniformity within the imaging volume.

2 Claims, 2 Drawing Sheets

OPEN MRI MAGNET WITH UNIFORM MAGNETIC FIELD

BACKGROUND OF THE INVENTION

The present invention relates generally to a superconductive magnet used to generate a high magnetic field as part of a magnetic resonance imaging (MRI) diagnostic system, and more particularly to such a magnet having an open design and a magnetic field of high uniformity.

MRI systems employing superconductive or other type magnets are used in various fields such as medical diagnostics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil. Nb—Ti superconductive coils typically operate at a temperature of generally 4 Kelvin, and Nb—Sn superconductive coils typically operate at a temperature of generally 10 Kelvin.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed. Although the magnet is so designed to have a highly uniform magnetic field within the imaging volume, manufacturing tolerances in the magnet and magnetic field disturbances caused by the environment at the field site of the magnet usually require that the magnet be corrected at the field site for such minor irregularities in the magnetic field. Typically, the magnet is shimmed at the field site by using pieces of iron, or, for Nb—Ti superconductive magnets cooled by liquid helium, by using numerous Nb—Ti superconductive correction coils. The correction coils are placed within the superconductive coil assembly radially near and radially inward of the main coils. Each correction coil carries a different, but low, electric current in any required direction including a direction opposite to the direction of the electric current carried in the main coils. Shielding coils may also be used within the superconductive coil assembly to prevent the high magnetic field created by and surrounding the main coils from adversely interacting with electronic equipment in the vicinity of the magnet. Such shielding coils carry electric current of generally equal amperage, but in an opposite direction, to the electric current carried in the main coils and are positioned radially outward of the main coils.

Open magnets typically employ two spaced-apart superconductive coil assemblies with the space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. Before Applicants' invention, known superconductive open magnets existed only in the literature. However, the literature is silent on how such magnets can be designed to have a magnetic field of high uniformity within the imaging volume when the creation of the open space between the superconductive coil assemblies grossly distorts the magnetic field creating a magnetic field of low uniformity within the imaging volume. Such magnetic field distortion is well beyond that which can be overcome by using known magnet shimming technology.

What is needed is an open MRI magnet designed to have a highly uniform magnetic field within its imaging volume despite the gross magnetic field distortions created by the open space between the magnet's superconductive coil assemblies.

SUMMARY OF THE INVENTION

It is an object of the invention to provide an open superconductive MRI magnet designed to have a magnetic field of high uniformity within its imaging volume.

The open MRI magnet of the invention includes a first superconductive coil assembly including a generally toroidal-shaped first coil housing, a generally annular-shaped first superconductive main coil, and a generally annular-shaped first superconductive bucking coil. The first coil housing surrounds a first bore and has a generally longitudinal first axis. The first main coil and the first bucking coil are each generally coaxially aligned with the first axis and disposed within the first coil housing with the first bucking coil spaced radially inward and radially apart from the first main coil. The first main coil carries a first main electric current in a first direction, and the first bucking coil carries a first bucking electric current in a direction opposite to the first direction. The open MRI magnet of the invention also includes a second superconductive coil assembly including a generally toroidal-shaped second coil housing, a generally annular-shaped second superconductive main coil, and a generally annular-shaped second superconductive bucking coil. The second coil housing is longitudinally spaced apart from the first coil housing, surrounds a second bore, and has a generally longitudinal second axis which is generally coaxially aligned with the first axis. The second main coil and the second bucking coil are each generally coaxially aligned with the second axis and disposed within the second coil housing with the second bucking coil spaced radially inward and radially apart from the second main coil. The second main coil carries a second main electric current in the first direction, and the second bucking coil carries a second bucking electric current in the opposite direction.

In preferred embodiments, the first bucking coil is spaced radially apart from the first main coil a distance equal generally to at least twice the radial thickness of the first main coil, all the electric currents are generally equal in amperage, and the superconductive coil assemblies are generally mirror-image.

Several benefits and advantages are derived from the invention. With Applicant's open MRI magnet design, bucking coils may be chosen by magnetic field analysis to overcome the gross magnetic field distortions within the imaging volume of the main coils (created by the open space between the magnet's superconductive coil assemblies) to produce a magnetic field of high uniformity within the imaging volume. Applicant's highly uniform magnetic field permits high quality MRI imaging. Applicant's open magnet design overcomes any claustrophobia feelings of patients. Applicant's design of an open magnet with a highly uniform magnetic field gives access to the patient by medical personnel for surgery or other medical procedures during high-quality MRI imaging.

BRIEF DESCRIPTION OF THE DRAWINGS

The accompanying drawings illustrate a preferred embodiment of the present invention wherein.

DETAILED DESCRIPTION OF THE INVENTION

Figure 1:
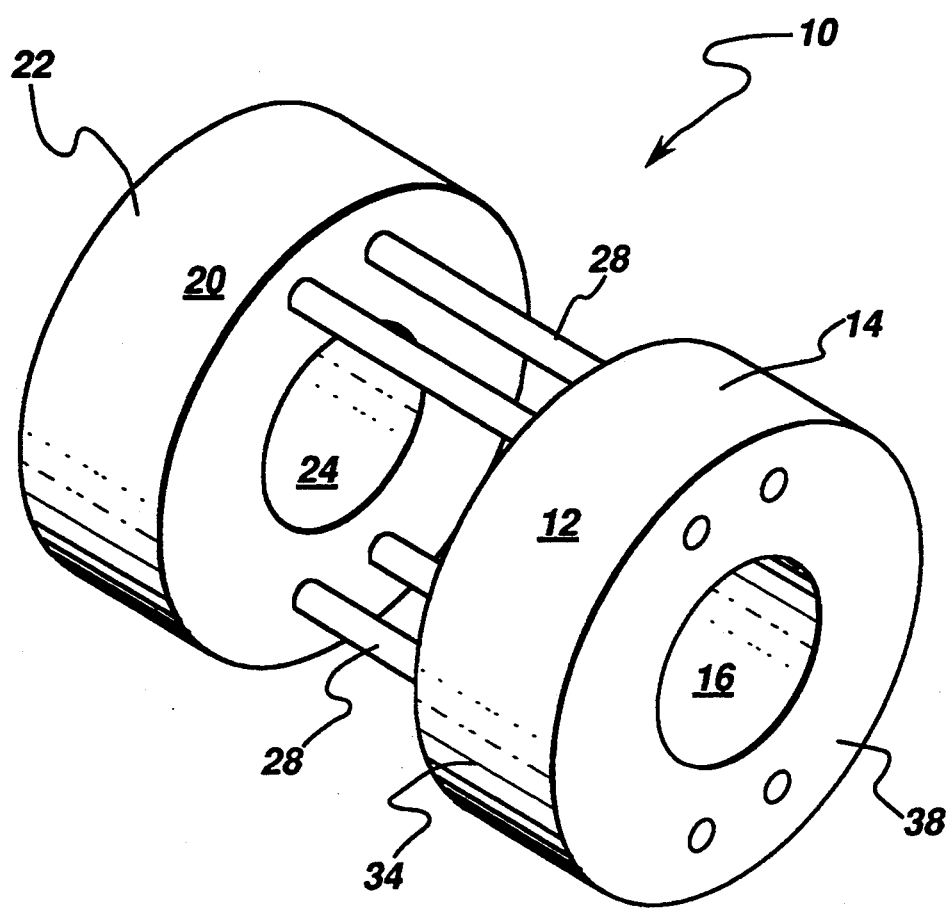
FIG. 1 is a perspective view of the open MRI magnet of the invention.
Figure 2:
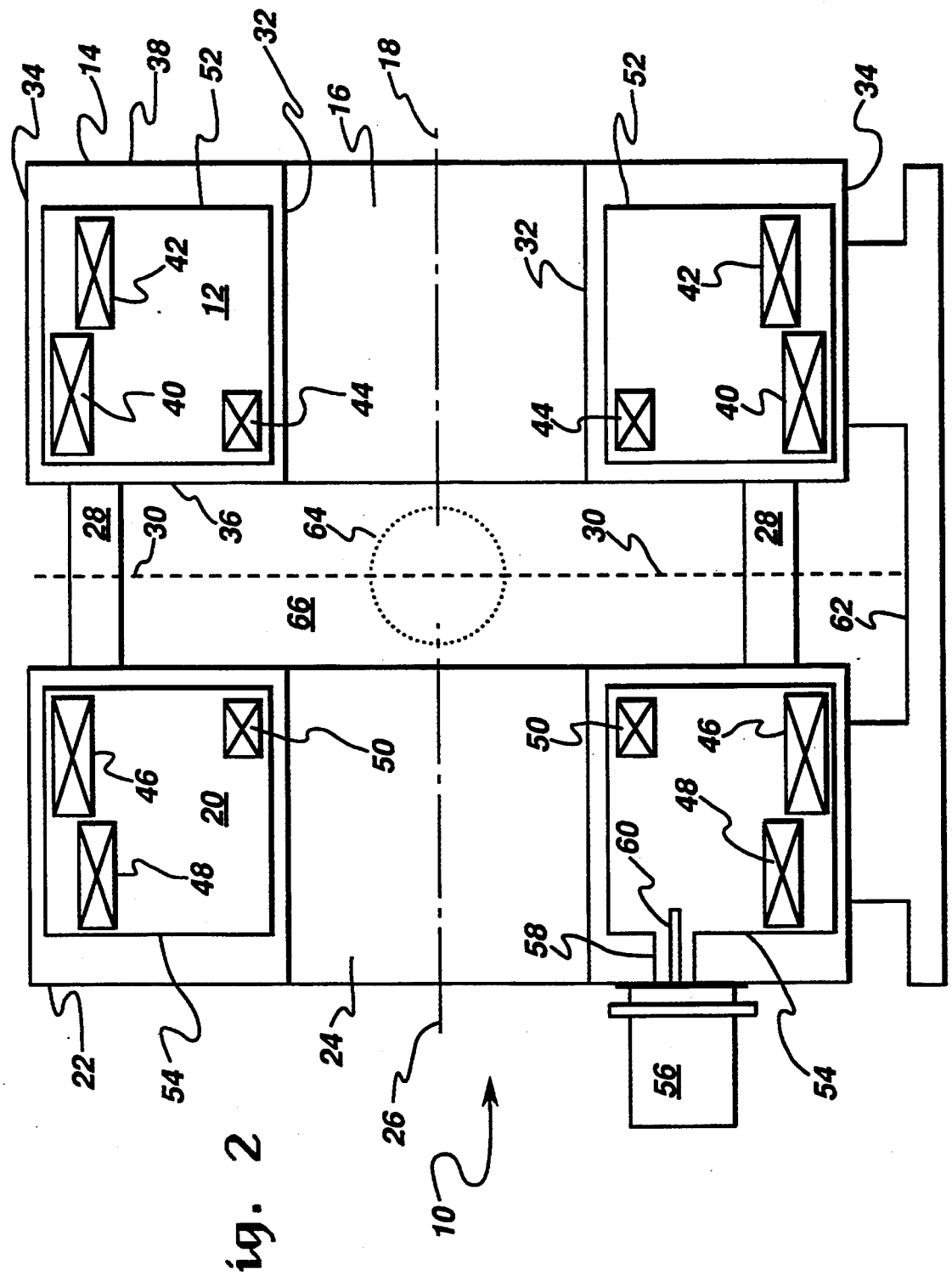
FIG. 2 is a schematic cross-sectional side-elevational view of the MRI magnet of FIG. 1 with a cryocooler coldhead and magnet floor mount added.

Referring now to the drawings, wherein like numerals represent like elements throughout, FIGS. 1-2 show the open magnetic resonance imaging (MRI) magnet 10 of the present invention. The magnet 10 includes a first superconductive coil assembly 12 with a generally toroidal-shaped first coil housing 14 which surrounds a first bore 16 and which has a generally longitudinal first axis 18. The magnet 10 further includes a second superconductive coil assembly 20 with a generally toroidal-shaped second coil housing 22 which surrounds a second bore 24 and which has a generally longitudinal second axis 26. The second coil housing 22 is longitudinally spaced apart from the first coil housing 14 by structural posts 28, and the second axis 26 is generally coaxially aligned with the first axis 18. Preferably, the second superconductive coil assembly 20 is a generally mirror image of the first superconductive coil assembly 12 about a plane 30 (seen on edge as a dashed line in FIG. 2) oriented perpendicular to the first axis 18 and disposed longitudinally midway between the first and second coil housings 14 and 22.

The first coil housing 14 includes a first generally-circumferential outside surface 32 facing generally towards the first axis 18 and a second generally-circumferential outside surface 34 radially spaced apart from said first circumferential outside surface 32 and facing generally away from said first axis 18. The first coil housing 14 also includes a first generally-annular outside surface 36 facing generally towards the plane 30 and a second generally-annular outside surface 38 longitudinally spaced apart from the first annular outside surface 36 and facing generally away from the plane 30.

The first superconductive coil assembly 12 also includes a generally annular-shaped first superconductive main coil 40, preferably a generally annular-shaped first additional superconductive main coil 42, and a generally annular-shaped first superconductive bucking coil 44. The first superconductive coils 40, 42 and 44 are conventionally supported on coil forms (not shown in the figures).

The first main coil 40 is generally coaxially aligned with the first axis 18, is disposed within the first coil housing 14, and carries a first main electric current in a first direction. The first direction is defined to be either a clockwise or a counterclockwise circumferential direction about the first axis 18 with any slight longitudinal component of current direction being ignored. The first additional main coil 42 is generally coaxially aligned with the first axis 18, is disposed within the first coil housing 14, is longitudinally spaced apart from the first main coil 40, and carries a first additional main electric current in the first direction (i.e., the direction of the electric current carried by the first main coil 40). Extra additional main coils may be needed to achieve a high magnetic field strength without exceeding the critical current density of the superconductor being used in the coils, as is known to those skilled in the art.

The first bucking coil 44 is generally coaxially aligned with the first axis 18, is disposed within the first coil housing 14, and carries a first bucking electric current in a direction opposite to the first direction (i.e., in a direction opposite to the direction of the electric current carried by the first main coil 40). The first bucking coil 44 is spaced radially inward and radially apart from the first main coil 40.

Preferably, the first main coil 40 is disposed radially towards the second circumferential outside surface 34, and the first bucking coil 44 is disposed radially towards the first circumferential outside surface 32. A coil is said to be disposed towards one of two spaced apart surfaces when it is disposed closer to the one surface than the other surface. Thus, the first main coil 40 is disposed radially closer to the second circumferential outside surface 34 than to the first circumferential outside surface 32. Likewise, the first bucking coil 44 is disposed radially closer to the first circumferential outside surface 32 than to the second circumferential outside surface 34. In an exemplary embodiment, the first additional main coil 42 is disposed radially towards the second circumferential outside surface 34 at a radial distance from the first axis 18 which is smaller than that of the first main coil 40. It is preferred that the longitudinal distance of the first main coil 40 from the plane 30 is generally equal to the longitudinal distance of the first bucking coil 44 from the plane 30.

Preferably, the first main coil 40 is disposed longitudinally towards the first annular outside surface 36, and the first bucking coil 44 is disposed longitudinally towards the first annular outside surface 36. In an exemplary embodiment, the first additional main coil 42 is disposed longitudinally towards the second annular outside surface 38.

It is preferred that the first main electric current of the first main coil 40, the electric current of the first additional main coil 42, and the first bucking electric current of the first bucking coil 44 are generally equal in amperage.

The first main coil 40 typically would be a superconductive wire or superconductive tape wound such that the first main coil 40 has a longitudinal extension and a radial extension (i.e., radial thickness) far greater than the corresponding dimensions of the superconductive wire or superconductive tape. Preferably, the first bucking coil 44 is spaced radially apart from the first main coil 40 a distance equal generally to at least twice the radial thickness of the first main coil 40. In an exemplary embodiment, the first main coil 40 has a longitudinal extension and is disposed such that the first main coil 40 totally longitudinally overlaps the first bucking coil 44.

As previously mentioned and as shown in the figures, the second superconductive coil assembly 20 is a generally mirror image of the first superconductive coil assembly 12 about the plane 30. Therefore, in addition to the second coil housing 22, the second superconductive coil assembly 20 also includes a generally annular-shaped second superconductive main coil 46, preferably a generally annular-shaped second additional superconductive main coil 48, and a generally annular-shaped second superconductive bucking coil 50. The second superconductive coils 46, 48 and 50 are conventionally supported on coil forms (not shown in the figures).

The second main coil 46 is generally coaxially aligned with the second axis 26, is disposed within the second coil housing 22, and carries a second main electric current in the first direction (i.e., in the same direction as the electric current in the first main coil 40). The second additional main coil 48 is generally coaxially aligned with the second axis 26, is disposed within the second coil housing 22, is longitudinally spaced apart from the second main coil 46, and carries a second additional main electric current in the first direction. Extra additional main coils may be needed by the second superconductive coil assembly 20 to balance any extra additional main coils of the first superconductive coil assembly 12, as can be appreciated by those skilled in the art. The open MRI magnet 10 has its superconductive coil assemblies 12 and 20 include main coils 40 and 46 either alone or in combination with one or more additional main coils 42 and 48 such that the magnet 10 has a field strength of generally at least 0.3 Tesla within an imaging volume having a volume size at least equal to that of a spherical imaging volume having a diameter of generally 7 inches.

The second bucking coil 50 is generally coaxially aligned with the second axis 26, is disposed within the second coil housing 22, and carries a second bucking electric current in a direction opposite to the first direction (i.e., in a direction opposite to the direction of the electric current carried by the first main coil 40). The second bucking coil 50 is spaced radially inward and radially apart from the second main coil 46. The magnet 10 has its first and second superconductive coil assemblies 12 and 20 include bucking coils 44 and 50 alone or in combination with additional bucking coils (not shown) such that the design peak-to-peak magnetic field inhomogeneity within the imaging volume is less than generally 25 parts per million.

Applicants constructed an exemplary embodiment of the open MRI magnet 10 of their invention with mirror-image first and second superconductive coil assemblies 12 and 20 using a conventional cryocooler (i.e., a Gifford-McMahon cryocooler) for cooling all of the superconductive coils to a temperature below their critical temperature to achieve and sustain superconductivity. Therefore, the first and second coil housings 14 and 22 were made to be first and second vacuum enclosures, and a conventional first or second thermal shield 52 or 54 was interposed between the superconductive coils and the vacuum enclosure of the corresponding superconductive coil assembly 12 or 20 as shown in FIG. 2. The coil housings 14 and 22 and the hollow structural posts 28 provided a single vacuum structure. Conventional thermal insulators (not shown) were used to support the superconductive coils within the thermal shields and to support the thermal shields within the vacuum enclosures. The cryocooler coldhead 56 was attached to the second coil housing 22, and the coldhead's first stage 58 was thermally connected to the second thermal shield 54. The coldhead's second stage 60 was thermally connected to the second main coil 46, the second additional main coil 48, and the second bucking coil 50 (such thermal connections being straightforward and not shown in the figures). The superconductive coils 46, 48 and 50 of the second superconductive coil assembly 20 were thermally connected to those 40, 42 and 44 of the first superconductive coil assembly 12, and the second thermal shield 54 was thermally connected to the first thermal shield 52 by appropriate thermal connectors within the hollow structural posts 28 (such thermal connections being straightforward and not shown in the figures). The magnet 10 was supported on a conventional magnet floor mount 62.

The constructed magnet 10 (to be hereinafter described) was designed by Applicants to have a generally spherical imaging volume 64 (shown as a dotted circle in FIG. 2) centered generally at the intersection of the plane 30 and the first axis 18 with a magnetic field of generally 0.5 Tesla, a design peak-to-peak magnetic field inhomogeneity of less than 3 parts per million (ppm), and a diameter of generally 12 inches. Such design was made by Applicants using the principles of the present invention, previously disclosed herein, together with conventional magnetic field analysis, as is within the skill of the artisan.

The open MRI magnet 10 constructed by Applicants had its first coil housing 14 (i.e., first vacuum enclosure) longitudinally disposed generally 11 inches from the plane 30, had an inner radius of generally 19 inches (which is the radius of the first bore 16), an outer radius of generally 36.5 inches, and a longitudinal thickness of generally 18 inches. The first main coil 40 extended longitudinally generally 6 inches, extended radially generally 1.5 inches, was longitudinally disposed generally 12.6 inches from the plane 30, was radially disposed generally 32.5 inches from the first axis 18, with the first main coil 40 having generally 83,000 feet of generally 0.12-inch wide and generally 0.01-inch thick Nb—Sn superconductive tape at a temperature of generally 10 Kelvin with the first main electric current having an amperage of generally 65 amperes. The first bucking coil 44 extended longitudinally generally 2 inches, extended radially generally 1 inch, was longitudinally disposed generally 13 inches from the plane 30, was radially disposed generally 21 inches from the first axis 18, with the first bucking coil 44 having generally 11,000 feet of generally 0.12-inch wide and generally 0.01-inch thick Nb—Sn superconductive tape at a temperature of generally 10 Kelvin with the first bucking electric current having an amperage of generally 65 amperes. The first additional main coil 42 extended longitudinally generally 7 inches, extended radially generally 1.2 inches, was longitudinally disposed generally 19.2 inches from the plane 30, was radially disposed generally 31.8 inches from the first axis 18, with the first additional main coil 42 having generally 79,000 feet of generally 0.12-inch wide and generally 0.01-inch thick Nb—Sn superconductive tape at a temperature of generally 10 Kelvin with said first main electric current having an amperage of generally 65 amperes. Such magnet was thus designed to have its generally spherical imaging volume 64 centered generally at the intersection of the plane 30 and the first axis 18 with a magnetic field of generally 0.5 Tesla, a design peak-to-peak magnetic field inhomogeneity of less than 3 parts per million (ppm), and a diameter of generally 12 inches. Because of manufacturing tolerances and magnetic field site disturbances, the measured inhomogeneity was 1000 ppm (which is considered to be a good unshimmed level) which Applicants brought down to 10 ppm (which is considered to be an excellent level for high quality MRI imaging) using conventional iron shims, as is within the skill of the artisan. It is noted that without the bucking coils 44 and 50, the open magnet 10 would have had a design peak-to-peak magnetic field inhomogeneity of more than 1000 ppm which can not be reduced by shimming because a magnet can never be shimmed below its design level of magnetic field inhomogeneity!

The magnet 10 of the invention provides an open MRI magnet design which increases patient comfort and physician access while maintaining high quality imaging through the use of bucking coils which shape the magnetic field of the main coils (and any additional main coils) to overcome the gross magnetic field distortions created by the magnet's open space 66. It was Applicants who first discovered that high strength magnetic fields in open MRI magnets could be made to be magnetic fields of high uniformity.

The foregoing description of a preferred embodiment of the invention has been presented for purposes of illustration. It is not intended to be exhaustive or to limit the invention to the precise form disclosed, and obviously many modifications and variations are possible in light of the above teaching. For example, the superconductive coil assemblies 12 and 20 of the magnet 10 of the invention are not limited to being cryocooler-cooled, and may be liquid-helium (or other cryogenic) cooled. It is intended that the scope of the invention be defined by the claims appended hereto.

We claim:

1. An open magnetic resonance imaging magnet comprising:
   a) a first superconductive coil assembly including:
      (1) a generally toroidal-shaped first coil housing surrounding a first bore and having a generally longitudinal first axis;
      (2) a generally annular-shaped first superconductive main coil generally coaxially aligned with said first axis, disposed within said first coil housing, and carrying a first main electric current in a first direction;
      (3) a generally annular-shaped first superconductive bucking coil generally coaxially aligned with said first axis, disposed within said first coil housing, and carrying a first bucking electric current in a direction opposite to said first direction, wherein said first bucking coil is spaced radially inward and radially apart from said first main coil; and
   b) a second superconductive coil assembly including:
      (1) a generally toroidal-shaped second coil housing longitudinally spaced apart from said first coil housing, surrounding a second bore, and having a generally longitudinal second axis generally coaxially aligned with said first axis;
      (2) a generally annular-shaped second superconductive main coil generally coaxially aligned with said second axis, disposed within said second coil housing, and carrying a second main electric current in said first direction; and
      (3) a generally annular-shaped second superconductive bucking coil generally coaxially aligned with said second axis, disposed within said second coil housing, and carrying a second bucking electric current in said opposite direction, wherein said second bucking coil is spaced radially inward and radially apart from said second main coil;

wherein said first main electric current and said first bucking electric current are generally equal in amperage;

wherein said second superconductive coil assembly is a generally mirror image of said first superconductive coil assembly about a plane oriented perpendicular to said first axis and disposed longitudinally midway between said first and second toil housings:

wherein said first main coil has a radial thickness, wherein said first bucking coil is spaced radially apart from said first main coil a distance equal generally to at least twice the radial thickness of said first main coil, and wherein said first main coil totally longitudinally overlaps said first bucking coil;

wherein said first coil housing further includes a first generally-annular outside surface facing generally towards said plane, a second generally-annular outside surface longitudinally spaced apart from said first annular outside surface and facing generally away from said plane, a first generally-circumferential outside surface facing generally towards said first axis, and a second generally-circumferential outside surface radially spaced apart from said first circumferential outside surface and facing generally away from said first axis, wherein said first main coil is disposed longitudinally towards said first annular outside surface and radially towards said second circumferential outside surface, and wherein said first bucking coil is disposed longitudinally towards said first annular outside surface and radially towards said first circumferential outside surface;

wherein the longitudinal distance of said first main coil from said plane is generally equal to the longitudinal distance of said first bucking coil from said plane; and wherein said first superconductive coil assembly also includes a generally annular-shaped first additional superconductive main coil generally coaxially aligned with said first axis, disposed within said first coil housing, carrying an electric current in said first direction, disposed longitudinally towards said second annular outside surface and longitudinally spaced apart from said first main coil, and disposed radially towards said second circumferential outside surface at a radial distance from said first axis which is smaller than that of said first main coil.

2. The magnet of claim 1, wherein:
a) said first coil housing is a first vacuum enclosure longitudinally disposed generally 11 inches from said plane, has an inner radius of generally 19 inches, an outer radius of generally 36.5 inches, and a longitudinal thickness of generally 18 inches;
b) said first main coil extends longitudinally generally 6 inches, extends radially generally 1.5 inches, is longitudinally disposed generally 12.6 inches from said plane, is radially disposed generally 32.5 inches from said first axis, with said first main coil having generally 83,000 feet of generally 0.12-inch wide and generally 0.01-inch thick Nb—Sn superconductive tape at a temperature of generally 10 Kelvin with said first main electric current having an amperage of generally 65 amperes;
c) said first bucking coil extends longitudinally generally 2 inches, extends radially generally 1 inch, is longitudinally disposed generally 13 inches from said plane, is radially disposed generally 21 inches from said first axis, with said first bucking coil having generally 11,000 feet of generally 0.12-inch wide and generally 0.01-inch thick Nb—Sn superconductive tape at a temperature of generally 10 Kelvin with said first bucking electric current having an amperage of generally 65 amperes; and d) said first additional main coil extends longitudinally generally 7 inches, extends radially generally 1.2 inches, is longitudinally disposed generally 19.2 inches from said plane, is radially disposed generally 31.8 inches from said first axis, with said first additional main coil having generally 79,000 feet of generally 0.12-inch wide and generally 0.01-inch thick Nb—Sn superconductive tape at a temperature of generally 10 Kelvin with said first main electric current having an amperage of generally 65 amperes; whereby said magnet has a a generally spherical imaging volume centered generally at the intersection of said plane and said first axis with a magnetic field of generally 0.5 Tesla, a design peak-to-peak magnetic field inhomogeneity of less than 3 parts per million, and a diameter of generally 12 inches.

* * * * *